(12) United States Patent
Tsai et al.

(10) Patent No.: US 11,258,445 B2
(45) Date of Patent: Feb. 22, 2022

(54) RADIO FREQUENCY APPARATUS AND VOLTAGE GENERATING DEVICE THEREOF

(71) Applicant: RichWave Technology Corp., Taipei (TW)

(72) Inventors: Hsien-Huang Tsai, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/010,838

(22) Filed: Sep. 3, 2020

(65) Prior Publication Data
US 2021/0119628 A1 Apr. 22, 2021

(30) Foreign Application Priority Data
Oct. 17, 2019 (CN) .......................... 201910986857.8

(51) Int. Cl.
*H03K 17/687* (2006.01)
*H03K 17/10* (2006.01)
(Continued)

(52) U.S. Cl.
CPC ......... *H03K 17/6871* (2013.01); *G05F 1/585* (2013.01); *G05F 1/62* (2013.01);
(Continued)

(58) Field of Classification Search
CPC ............. H03K 17/6871; H03K 17/693; H03K 17/007; H03K 17/063; H03K 17/102;
(Continued)

(56) References Cited

U.S. PATENT DOCUMENTS 3,942,039 A 3/1976 Kikuchi et al.
5,717,356 A 2/1998 Kohama
(Continued)

FOREIGN PATENT DOCUMENTS

CN 101866635 10/2010
CN 107039057 8/2017
(Continued)

OTHER PUBLICATIONS

"Search Report of Europe Counterpart Application", dated Mar. 1, 2021, p. 1-p. 6.
(Continued)

*Primary Examiner* — Jung Kim
(74) *Attorney, Agent, or Firm* — JCIPRNET (57) ABSTRACT

A radio frequency apparatus and a voltage generating device thereof are provided. The voltage generating device includes a first switch and a second switch. A first terminal of the first switch receives a first voltage. A control terminal of the first switch receives a second voltage. A first terminal of the second switch receives the second voltage. A control terminal of the second switch receives the first voltage. A second terminal of the second switch and a second terminal of the first switch are coupled to an output node, wherein the output node outputs an output voltage related to at least one of the first voltage and the second voltage.

20 Claims, 6 Drawing Sheets

(51) Int. Cl.
  *H03K 19/0185* (2006.01)
  *G05F 1/62* (2006.01)
  *H03K 17/06* (2006.01)
  *G05F 1/585* (2006.01)
  *G05F 1/66* (2006.01)

(52) U.S. Cl.
  CPC .............. *G05F 1/66* (2013.01); *H03K 17/063* (2013.01); *H03K 17/102* (2013.01); *H03K 19/0185* (2013.01)

(58) Field of Classification Search
  CPC .............. H03K 17/687; H03K 19/0944; H03K 19/0185; G05F 1/46; G05F 1/465; G05F 1/585; G05F 1/62; G05F 1/66; G05F 3/02; G05F 3/08; G05F 3/20; G06F 1/26
  See application file for complete search history.

(56) References Cited

U.S. PATENT DOCUMENTS

| | | | |
|---|---|---|---|
| 5,796,297 | A | 8/1998 | Brigati et al. |
| 7,173,471 | B2 | 2/2007 | Nakatsuka et al. |
| 7,460,852 | B2 | 12/2008 | Burgener et al. |
| 7,782,116 | B2 * | 8/2010 | Jasa ................. H03K 3/356182 327/389 |
| 7,796,969 | B2 | 9/2010 | Kelly et al. |
| 8,093,940 | B2 | 1/2012 | Huang et al. |
| 8,258,853 | B2 * | 9/2012 | Ku ..................... H03K 19/0948 327/408 |
| 9,231,578 | B2 | 1/2016 | Chih-Sheng |
| 9,543,929 | B2 | 1/2017 | Chen |
| 2006/0001473 | A1 | 1/2006 | Yasuda et al. |
| 2007/0085592 | A1 | 4/2007 | Yasuda et al. |
| 2011/0254614 | A1 | 10/2011 | Huang et al. |
| 2012/0049938 | A1 | 3/2012 | Ishimori et al. |
| 2014/0176225 | A1 | 6/2014 | Ha et al. |
| 2016/0380632 | A1 | 12/2016 | Crandall |

FOREIGN PATENT DOCUMENTS

| | | |
|---|---|---|
| EP | 0720292 | 7/1996 |
| EP | 1487103 | 12/2004 |
| JP | 2000223902 | 8/2000 |
| JP | 2001068984 | 3/2001 |
| TW | 200744315 | 12/2007 |
| WO | 2007136050 | 11/2007 |
| WO | 2012070162 | 5/2012 |

OTHER PUBLICATIONS

"Office Action of Taiwan Counterpart Application", dated Jul. 9, 2021, p. 1-p. 9.

"Office Action of China Counterpart Application", dated Nov. 10, 2021, p. 1-p. 6.

* cited by examiner

RADIO FREQUENCY APPARATUS AND VOLTAGE GENERATING DEVICE THEREOF

CROSS-REFERENCE TO RELATED APPLICATION

This application claims the priority benefit of China application no. 201910986857.8, filed on Oct. 17, 2019. The entirety of the above-mentioned patent application is hereby incorporated by reference herein and made a part of this specification.

TECHNICAL FIELD

The invention relates to an electronic circuit, and more particularly, to a radio frequency (RF) apparatus and a voltage generating device thereof.

BACKGROUND

Many radio frequency (RF) electronic products (e.g., mobile phones, wireless pagers, wireless infrastructure, satellite communication devices, television equipment, and/or other radio products) are configured with a RF circuit (e.g., RF switch) and other elements. A driving circuit could change a transmission path of the RF switch according to a control signal of the system. How to use the voltage of the control signal to generate a power voltage of the driving circuit is one of the technical issues.

It should be noted that, the content in the paragraph "Description of Related Art" are intended to assist understanding the invention. Part of the content (or all content) disclosed in the paragraph "Description of Related Art" may not be the conventional technology known by a person of ordinary skill in the art. The content disclosed in the paragraph "Description of Related Art" may not mean the content is known by a person of ordinary skill in the art before application of the invention.

SUMMARY

The invention provides a radio frequency apparatus and a voltage generating device thereof that can use voltage of a first voltage and (or) a second voltage to generate an output voltage.

The voltage generating device of the invention includes a first switch and a second switch. A first terminal of the first switch is configured to receive the first voltage. A control terminal of the first switch is configured to receive the second voltage. A first terminal of the second switch is configured to receive the second voltage. A control terminal of the second switch is configured to receive the first voltage. A second terminal of the second switch and a second terminal of the first switch are coupled to an output node, wherein the output node outputs the output voltage related to at least one of the first voltage and the second voltage.

The radio frequency apparatus of the invention includes a first switch, a second switch, a voltage regulating unit and a radio frequency circuit. A first terminal of the first switch is configured to receive the first voltage. A control terminal of the first switch is configured to receive the second voltage. A first terminal of the second switch is configured to receive the second voltage. A control terminal of the second switch is configured to receive the first voltage. A second terminal of the second switch and a second terminal of the first switch are coupled to an output node, wherein the output node outputs the output voltage related to at least one of the first voltage and the second voltage. The voltage regulating unit is coupled to the output node to receive the output voltage. The voltage regulating unit is configured to generate at least one of a positive voltage and a negative voltage related to the output voltage. The radio frequency circuit is coupled to the voltage regulating unit to receive the at least one of the positive voltage and the negative voltage. The radio frequency circuit is configured to control a conducting state of at least one radio frequency transmission path of the radio frequency circuit according to the first voltage.

To make the aforementioned more comprehensible, several embodiments accompanied with drawings are described in detail as follows.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". The terms such as "first", "second" and the like as recited in full text of the specification (including claims) are intended to give the elements names or distinguish different embodiments or scopes, and are not intended to limit an upper limit or a lower limit of the number of the elements nor limit an order of the elements. Moreover, wherever possible, elements/components/steps with same reference numerals represent same or similar parts in the drawings and embodiments. Elements/components/steps with the same reference numerals or names in different embodiments may be cross-referenced.

Figure 1:
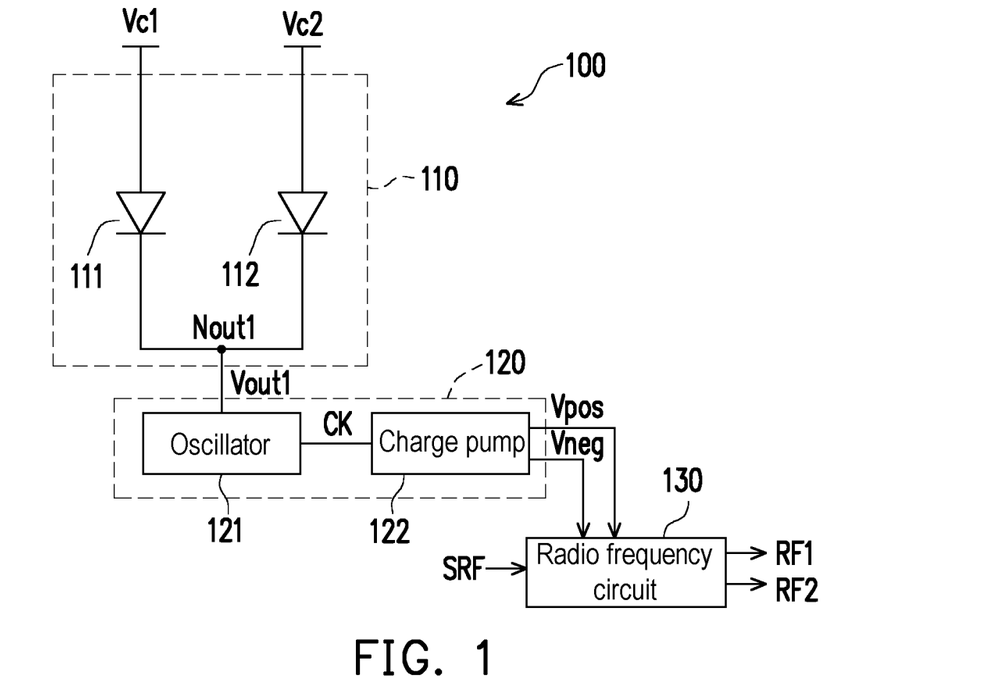
FIG. 1 is a circuit block diagram illustrating a radio frequency apparatus according to an embodiment.

FIG. 1 is a circuit block diagram illustrating a radio frequency apparatus 100 according to an embodiment. The radio frequency apparatus 100 shown by FIG. 1 includes a voltage generating device 110, a voltage regulating unit 120 and a radio frequency circuit 130. In the embodiment shown by FIG. 1, the voltage generating device 110 includes a diode 111 and a diode 112. An anode of the diode 111 could receive a control signal Vc1 (a first voltage). A cathode of the diode 111 is coupled to an output node Nout1. An anode of the diode 112 could receive a control signal Vc2 (a second voltage). In other embodiments, a first terminal of the diode 112 could receive a system voltage (the second voltage, such as a system voltage Vdd). A cathode of the diode 112 is coupled to the output node Nout1.

The voltage regulating unit 120 is coupled to the output node Nout1 to receive an output voltage Vout1. The voltage regulating unit 120 could generate at least one of a positive voltage Vpos and a negative voltage Vneg to be provided to the radio frequency circuit 130. In the embodiment shown by FIG. 1, the voltage regulating unit 120 includes an oscillator 121 and a charge pump 122. The oscillator 121 is coupled to the output node Nout1 to receive the output voltage Vout1. According to the output voltage Vout1, the oscillator 121 could generate a clock signal CK. This embodiment does not limit the implementation of the oscillator 121. For example, according to design requirements, the oscillator 121 may include a conventional oscillating circuit or other oscillating circuits.

The charge pump 122 is coupled to the oscillator 121 to receive the clock signal CK. The charge pump 122 could generate the positive voltage Vpos and/or the negative voltage Vneg according to the clock signal CK. This embodiment does not limit the implementation of the charge pump 122. For example, according to design requirements, the charge pump 122 may include a conventional charge pump circuit or other charge pump circuits.

The radio frequency circuit 130 is coupled to the voltage regulating unit 120 to receive the at least one of the positive voltage Vpos and the negative voltage Vneg. In some embodiments, the radio frequency circuit 130 could control a conducting state of at least one radio frequency transmission path of the radio frequency circuit 130 according to the control signal Vc1 (the first voltage). For instance, when the control signal Vc1 is in a first logic state, the radio frequency transmission path of the radio frequency circuit 130 could transmit a radio frequency signal SRF to a radio frequency transmitting terminal RF1. When the control signal Vc1 is in a second logic state, the radio frequency transmission path of the radio frequency circuit 130 could transmit the radio frequency signal SRF to a radio frequency transmitting terminal RF2.

In some other embodiments, the radio frequency circuit 130 could control the conducting state of at the least one radio frequency transmission path of the radio frequency circuit 130 according to the control signal Vc1 and the control signal Vc2. For instance, when the control signal Vc1 is in the first logic state and the control signal Vc2 is in the second logic state, the radio frequency transmission path of the radio frequency circuit 130 could transmit the radio frequency signal SRF to the radio frequency transmitting terminal RF1. When the control signal Vc1 is in the second logic state and the control signal Vc2 is in the first logic state, the radio frequency transmission path of the radio frequency circuit 130 could transmit the radio frequency signal SRF to the radio frequency transmitting terminal RF2. When both the control signal Vc1 and the control signal Vc2 are in the first logic state, the radio frequency transmission path of the radio frequency circuit 130 could transmit the radio frequency signal SRF to the radio frequency transmitting terminal RF1 and the radio frequency transmitting terminal RF2.

In any case, when the control signal Vc1 (or the control signal Vc2) passes through the diode 111 (or the diode 112), based on the characteristic of the diode 111 (or the diode 112), a voltage level of the output voltage Vout1 is lower than a voltage level of the control signal Vc1 (or control signal Vc2). For instance, it is assumed that a high logic level of the control signal Vc1 (or control signal Vc2) is 1.2V. Based on the voltage drop of the diode 111 (or the diode 112), the output voltage Vout1 of the output node Nout1 is 0.8V, which affects operations of the voltage regulating unit 120.

Figure 2:
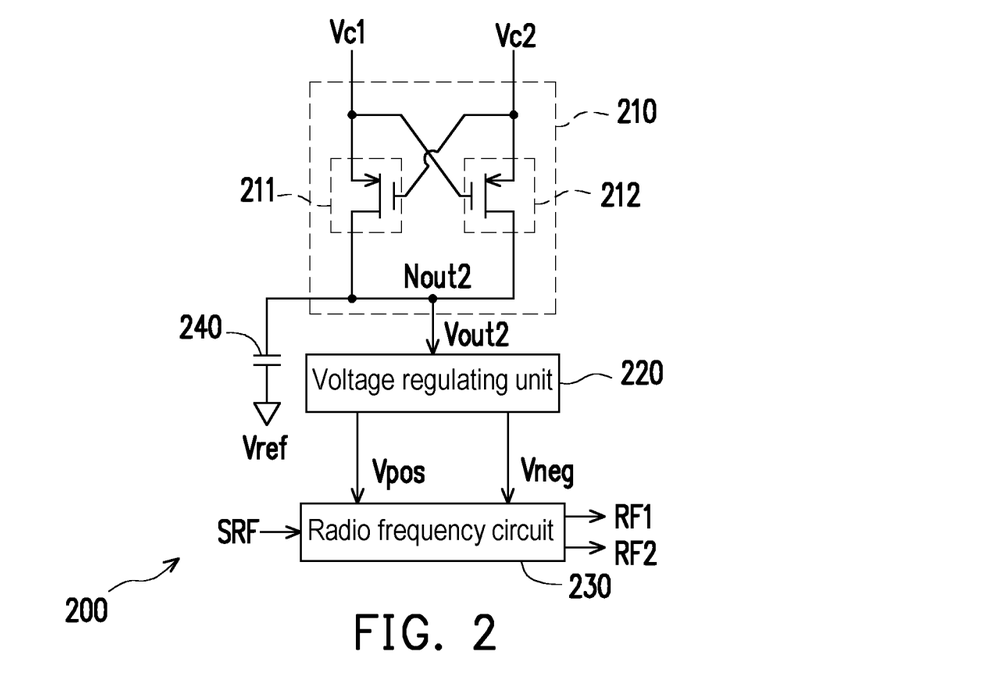
FIG. 2 is a circuit block diagram illustrating a radio frequency apparatus according to an embodiment of the invention.

FIG. 2 is a circuit block diagram illustrating a radio frequency apparatus 200 according to an embodiment of the invention. The radio frequency apparatus 200 shown by FIG. 2 includes a voltage generating device 210, a voltage regulating unit 220 and a radio frequency circuit 230. In the embodiment shown by FIG. 2, the voltage generating device 210 includes a switch 211 and a switch 212. The switch 211 and the switch 212 shown by FIG. 2 may be P-channel metal oxide semiconductor (PMOS) transistors. According to design requirements, in other embodiments, the switch 211 and the switch 212 shown by FIG. 2 may be other transistors, such as metal oxide semiconductor (MOS) transistors, bipolar junction transistors (BJT) or heterojunction bipolar transistors (HBT).

A first terminal of the switch 211 and a control terminal of the switch 212 could receive the control signal Vc1 (the first voltage). A first terminal of the switch 212 and a control terminal of the switch 211 could receive the control signal Vc2 (the second voltage). In other embodiments, the first terminal of the switch 212 and the control terminal of the switch 211 could receive the system voltage (the second voltage, such as the system voltage Vdd). A second terminal of the switch 211 and a second terminal of the switch 212 are coupled to an output node Nout2. The output node Nout2 outputs an output voltage Vout2 to the voltage regulating unit 220, wherein the output voltage Vout2 is related to at least one of the first voltage and the second voltage.

For instance, when the control signal Vc1 (the first voltage) is at a high logic level and the control signal Vc2 (the second voltage) is at a low logic level, the switch 211 is turn on and the switch 212 is turn off. Accordingly, the switch 211 could transmit the control signal Vc1 (the first voltage) to the output node Nout2 to generate the output voltage Vout2. When the control signal Vc1 (the first voltage) is at the low logic level and the control signal Vc2 (the second voltage) is at the high logic level, the switch 211 is turn off and the switch 212 is turn on. Accordingly, the switch 212 could transmit the control signal Vc2 (the second voltage) to the output node Nout2 to generate the output voltage Vout2.

The voltage generating device 210 could use voltage of the control signal Vc1 (the first voltage) and (or) the control signal Vc2 (the second voltage) to generate the output voltage Vout2. The voltage generating device 210 further uses the control signal Vc1 (the first voltage) and the control signal Vc2 (the second voltage) to control the switch 211 and the switch 212, respectively. When the switch 211 (or the switch 212) is turn on, the first voltage (or the second voltage) could be transmitted to the output node Nout2 with almost no voltage loss.

The voltage regulating unit 220 is coupled to the output node Nout2 to receive the output voltage Vout2. The voltage regulating unit 220 could generate at least one of a positive voltage Vpos and a negative voltage Vneg related to the output voltage Vout2. The radio frequency circuit 230 is coupled to the voltage regulating unit 220 to receive the positive voltage Vpos and/or the negative voltage Vneg. In certain embodiments, the radio frequency circuit 230 could control a conducting state of at least one radio frequency transmission path of the radio frequency circuit 230 according to the control signal Vc1 (the first voltage). For instance, when the control signal Vc1 is in a first logic state, the radio frequency transmission path of the radio frequency circuit 230 could transmit a radio frequency signal SRF to a radio frequency transmitting terminal RF1. When the control signal Vc1 is in a second logic state, the radio frequency transmission path of the radio frequency circuit 230 could transmit the radio frequency signal SRF to a radio frequency transmitting terminal RF2.

In some other embodiments, the radio frequency circuit 230 could control the conducting state of at the least one radio frequency transmission path of the radio frequency circuit 230 according to the control signal Vc1 and the control signal Vc2. For instance, when the control signal Vc1 is in the first logic state and the control signal Vc2 is in the second logic state, the radio frequency transmission path of the radio frequency circuit 230 could transmit the radio frequency signal SRF to the radio frequency transmitting terminal RF1, and does not transmit the radio frequency signal SRF to the radio frequency transmitting terminal RF2. When the control signal Vc1 is in the second logic state and the control signal Vc2 is in the first logic state, the radio frequency transmission path of the radio frequency circuit 230 could transmit the radio frequency signal SRF to the radio frequency transmitting terminal RF2, and does not transmit the radio frequency signal SRF to the radio frequency transmitting terminal RF1. When both the control signal Vc1 and the control signal Vc2 are in the first logic state, the radio frequency transmission path of the radio frequency circuit 230 could transmit the radio frequency signal SRF to the radio frequency transmitting terminal RF1 and the radio frequency transmitting terminal RF2. When both the control signal Vc1 and the control signal Vc2 are in the second logic state, the radio frequency circuit 230 does not transmit the radio frequency signal SRF to the radio frequency transmitting terminal RF1 and the radio frequency transmitting terminal RF2.

According to design requirements, in certain embodiments, the radio frequency apparatus 200 could also optionally include a capacitor 240. A first terminal of the capacitor 240 is coupled to the output node Nout2 to receive the output voltage Vout2. A second terminal of the capacitor 240 is coupled to a reference potential Vref (e.g., a ground voltage GND). The capacitor 240 could suppress the noise when the control signal Vc1 and the control signal Vc2 switch the logic state to provide the output voltage Vout2 more stably.

Figure 3:
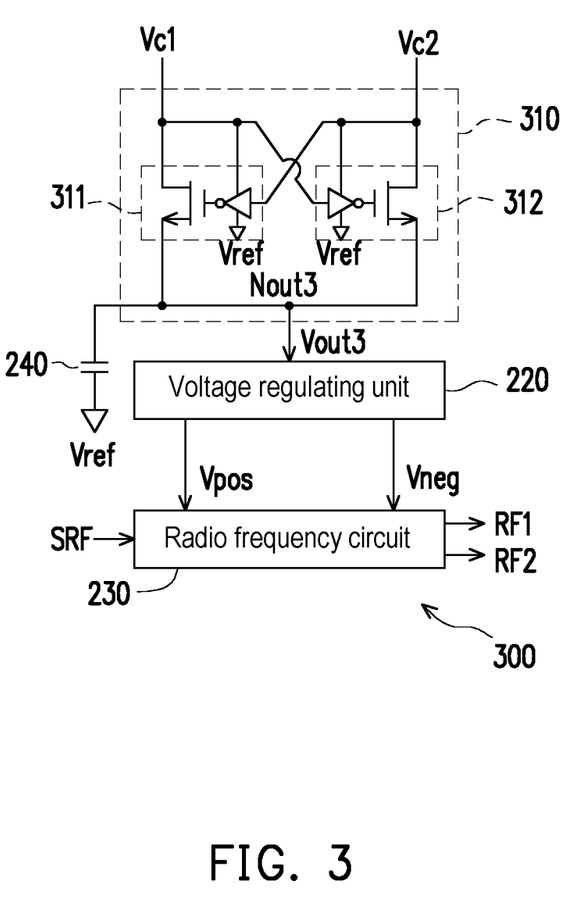
FIG. 3 is a circuit block diagram illustrating a radio frequency apparatus according to another embodiment of the invention.

FIG. 3 is a circuit block diagram illustrating a radio frequency apparatus 300 according to another embodiment of the invention. The radio frequency apparatus 300 shown by FIG. 3 includes a voltage generating device 310, a voltage regulating unit 220, a radio frequency circuit 230 and a capacitor 240. The voltage regulating unit 220, the radio frequency circuit 230 and the capacitor 240 shown by FIG. 3 could be referred to the related descriptions of the voltage regulating unit 220, the radio frequency circuit 230 and the capacitor 240 shown by FIG. 2, which are not repeated hereinafter.

In the embodiment shown by FIG. 3, the voltage generating device 310 includes a switch 311 and a switch 312. A first terminal of the switch 311 and a control terminal of the switch 312 could receive the control signal Vc1 (the first voltage). A first terminal of the switch 312 and a control terminal of the switch 311 could receive the control signal Vc2 (the second voltage). In other embodiments, the first terminal of the switch 312 and the control terminal of the switch 311 could receive the system voltage (the second voltage, such as the system voltage Vdd). A second terminal of the switch 311 and a second terminal of the switch 312 are coupled to an output node Nout3. The output node Nout3 outputs an output voltage Vout3 to the voltage regulating unit 220, wherein the output voltage Vout3 is related to at least one of the first voltage and the second voltage. The switch 311 and the switch 312 shown by FIG. 3 could be analogized with reference to the related descriptions of the switch 211 and the switch 212 shown by FIG. 2.

The switch 311 shown by FIG. 3 includes a first NOT gate and a first NMOS (N-channel metal oxide semiconductor) transistor, wherein a drain of the first NMOS transistor could receive the control signal Vc1 (the first voltage), a source of the first NMOS transistor could be coupled to the output node Nout3, an output terminal of the first NOT gate could be coupled to a gate of the first NMOS transistor, and an input terminal of the first NOT gate could receive the control signal Vc2 (the second voltage). The switch 312 shown by FIG. 3 includes a second NOT gate and a second NMOS transistor, wherein a drain of the second NMOS transistor could receive the control signal Vc2 (the second voltage), a source of the second NMOS transistor could be coupled to the output node Nout3, an output terminal of the second NOT gate could be coupled to a gate of the second NMOS transistor, and an input terminal of the second NOT gate could receive the control signal Vc1 (the first voltage).

The voltage generating device 310 could use voltage of the control signal Vc1 (the first voltage) and (or) the control signal Vc2 (the second voltage) to generate the output voltage Vout3. The voltage generating device 310 further uses the control signal Vc1 (the first voltage) and the control signal Vc2 (the second voltage) to control the switch 311 and the switch 312, respectively. When the switch 311 (or the switch 312) is turn on, the first voltage (or the second voltage) could be transmitted to the output node Nout3 with almost no voltage loss.

Figure 4:
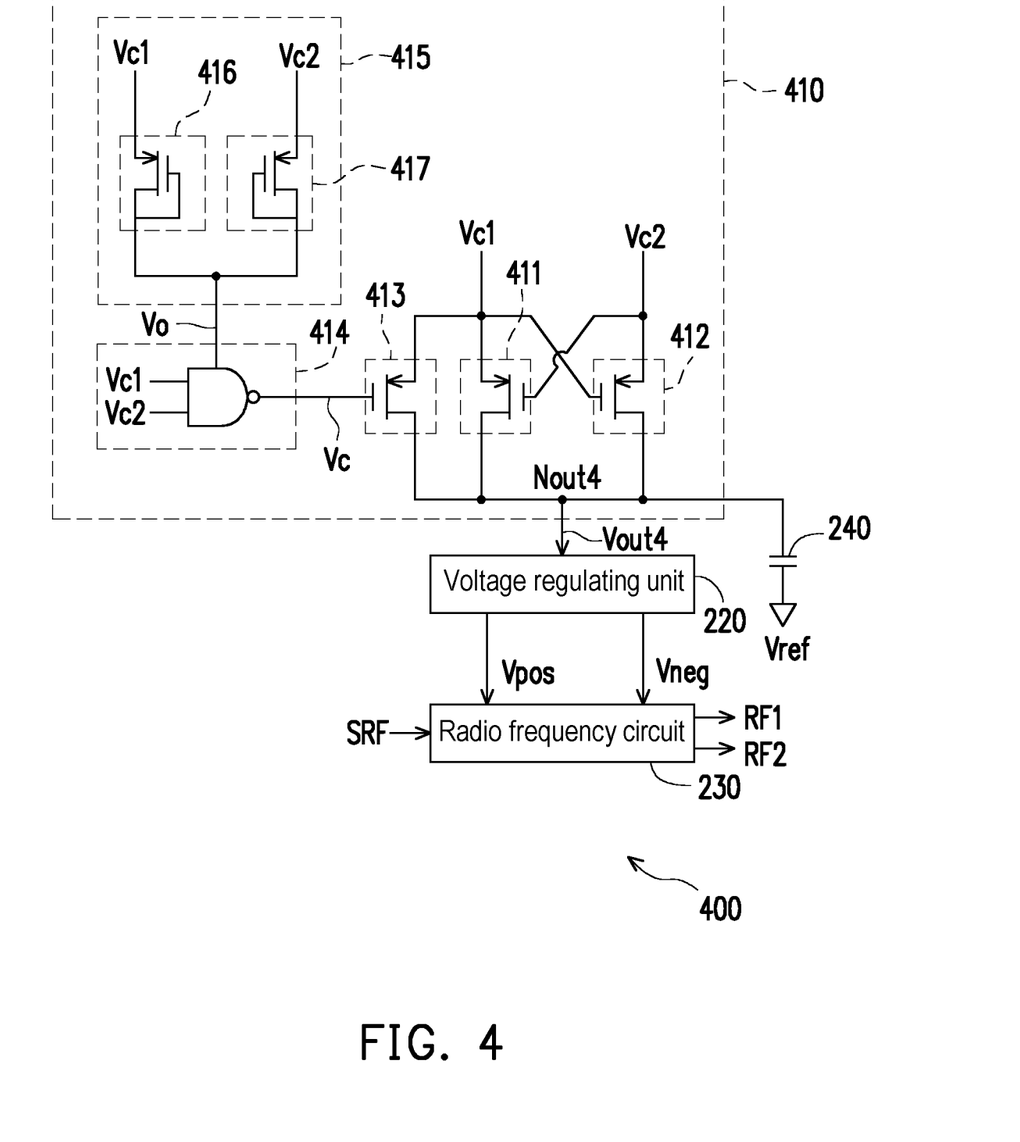
FIG. 4 is a circuit block diagram illustrating a radio frequency apparatus according to another embodiment of the invention.

FIG. 4 is a circuit block diagram illustrating a radio frequency apparatus 400 according to another embodiment of the invention. The radio frequency apparatus 400 shown by FIG. 4 includes a voltage generating device 410, a voltage regulating unit 220, a radio frequency circuit 230 and a capacitor 240. The voltage regulating unit 220, the radio frequency circuit 230 and the capacitor 240 shown by FIG. 4 could be referred to the related descriptions of the voltage regulating unit 220, the radio frequency circuit 230 and the capacitor 240 shown by FIG. 2, which are not repeated hereinafter.

In the embodiment shown by FIG. 4, the voltage generating device 410 includes a switch 412, a switch 412, a switch 413, a logic circuit 414 and a voltage generator 415. A first terminal of the switch 411 and a control terminal of the switch 412 could receive the control signal Vc1 (the first voltage). A first terminal of the switch 412 and a control terminal of the switch 411 could receive the control signal Vc2 (the second voltage). In other embodiments, the first terminal of the switch 412 and the control terminal of the switch 411 could receive the system voltage (the second voltage, such as the system voltage Vdd). A second terminal of the switch 411 and a second terminal of the switch 412 are coupled to an output node Nout4. The output node Nout4 outputs an output voltage Vout4 to the voltage regulating unit 220, wherein the output voltage Vout4 is related to at least one of the first voltage and the second voltage. The switch 411 and the switch 412 shown by FIG. 4 could be analogized with reference to the related descriptions of the switch 211 and the switch 212 shown by FIG. 2.

A first terminal of the switch 413 shown by FIG. 4 could receive the control signal Vc1 (the first voltage). In other embodiments, the first terminal of the switch 413 could receive the control signal Vc2 (the second voltage). A control terminal of the switch 413 is coupled to the logic circuit 414 to receive a control voltage Vc. A second terminal of the switch 413 is coupled to the output node Nout4. The switches 411, 412 and 413 shown by FIG. 4 may be PMOS transistors. According to design requirements, in other embodiments, the switch 411, the switch 412 and the switch 413 shown by FIG. 4 may be other transistors, such as metal oxide semiconductor (MOS) transistors, bipolar junction transistors (BJT) or heterojunction bipolar transistors (HBT).

The voltage generator 415 shown by FIG. 4 is coupled to a power terminal of the logic circuit 414 to provide a regulating voltage Vo. The voltage generator 415 could use the control signal Vc1 (the first voltage) and the control signal Vc2 (the second voltage) to generate the regulating voltage Vo. Here, the regulating voltage Vo is smaller than the output voltage Vout4. The logic circuit 414 is coupled to the control terminal of the switch 413 to provide the control voltage Vc. The logic circuit 414 could change the control voltage Vc according to the control signal Vc1 (the first voltage) and the control signal Vc2 (the second voltage).

For instance, when the control signal Vc1 (the first voltage) and the control signal Vc2 (the second voltage) are at the high logic level, the switch 411 and the switch 412 are turn off, and the logic circuit 414 turns on the switch 413 by the control voltage Vc. The turned on switch 413 could transmit the control signal Vc1 to the output node Nout4 as the output voltage Vout4.

Therefore, the voltage generating device 410 could use the voltage of the control signal Vc1 (the first voltage) and (or) the control signal Vc2 (the second voltage) to generate the output voltage Vout4. The voltage generating device 410 further uses the control signal Vc1 (the first voltage) and the control signal Vc2 (the second voltage) to control the switches 411, 412 and 413. When one of the switches 411, 412 and 413 is turn on, the first voltage and/or the second voltage could be transmitted to the output node Nout4 with almost no voltage loss.

In the embodiment shown by FIG. 4, the logic circuit 414 includes an NAND gate. A first input terminal and a second input terminal of the NAND gate receive the control signal Vc1 (the first voltage) and the control signal Vc2 (the second voltage), respectively. An output terminal of the NAND gate is coupled to the control terminal of the switch 413 to provide the control voltage Vc.

In the embodiment shown by FIG. 4, the voltage generator 415 includes a diode circuit 416 and a diode circuit 417. An anode of the diode circuit 416 could receive the control signal Vc1 (the first voltage). A cathode of the diode circuit 416 is coupled to the power terminal of the NAND gate of the logic circuit 414. An anode of the diode circuit 417 could receive the control signal Vc2 (the second voltage). A cathode of the diode circuit 417 is coupled to the power terminal of the NAND gate of the logic circuit 414.

In the embodiment shown by FIG. 4, the diode circuit 416 may be a diode-connected transistor, such as a diode-connected PMOS transistor, wherein a first terminal of the PMOS transistor serves as the anode of the diode circuit 416, a control terminal of the PMOS transistor is coupled to a second terminal of the PMOS transistor, and the second terminal of the PMOS transistor serves as the cathode of the diode circuit 416. The diode circuit 417 could be analogized with reference to the related description of the diode circuit 416, which is not repeated hereinafter.

Figure 5:
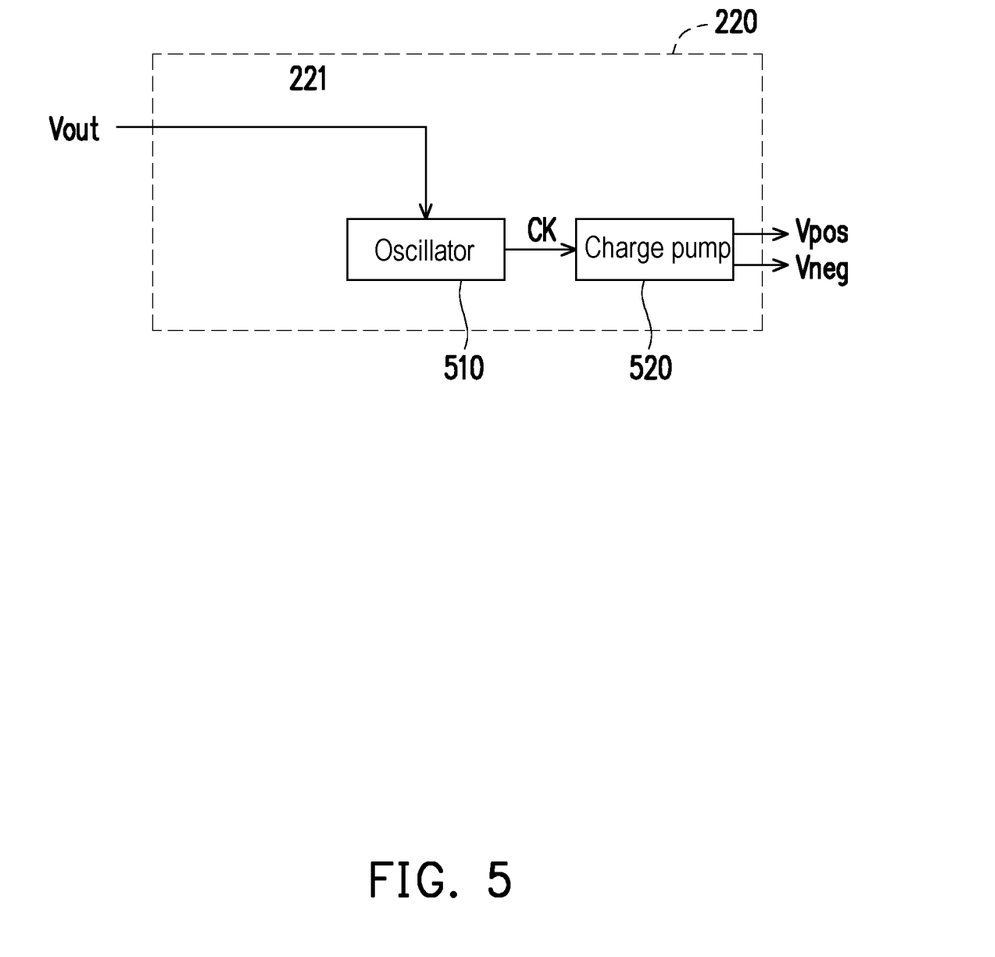
FIG. 5 is a circuit block diagram illustrating the voltage regulating unit shown by FIG. 2, FIG. 3 and FIG. 4 according to an embodiment of the invention.

FIG. 5 is a circuit block diagram illustrating the voltage regulating unit 220 shown by FIG. 2, FIG. 3 and FIG. 4 according to an embodiment of the invention. In the embodiment shown by FIG. 5, the voltage regulating unit 220 includes an oscillator 510 and a charge pump 520. The oscillator 510 receives an output voltage Vout. The output voltage Vout shown by FIG. 5 could be referred to related description of the output voltage Vout2 shown by FIG. 2, the output voltage Vout3 shown by FIG. 3, or the output voltage Vout4 shown by FIG. 4. The oscillator 510 could generate a clock signal CK related to the output voltage Vout. This embodiment does not limit the implementation of the oscillator 510. For example, according to design requirements, the oscillator 510 may include a conventional oscillating circuit or other oscillating circuits. A frequency of the clock signal CK may be determined according to design requirements.

The charge pump 520 is coupled to the oscillator 510 to receive the clock signal CK. The charge pump 520 could generate the positive voltage Vpos and the negative voltage Vneg according to the clock signal CK. This embodiment does not limit the implementation of the charge pump 520. For example, according to design requirements, the charge pump 520 may include a conventional charge pump circuit or other charge pump circuits. Levels of the positive voltage Vpos and the negative voltage Vneg may be determined according to design requirements.

Figure 6:
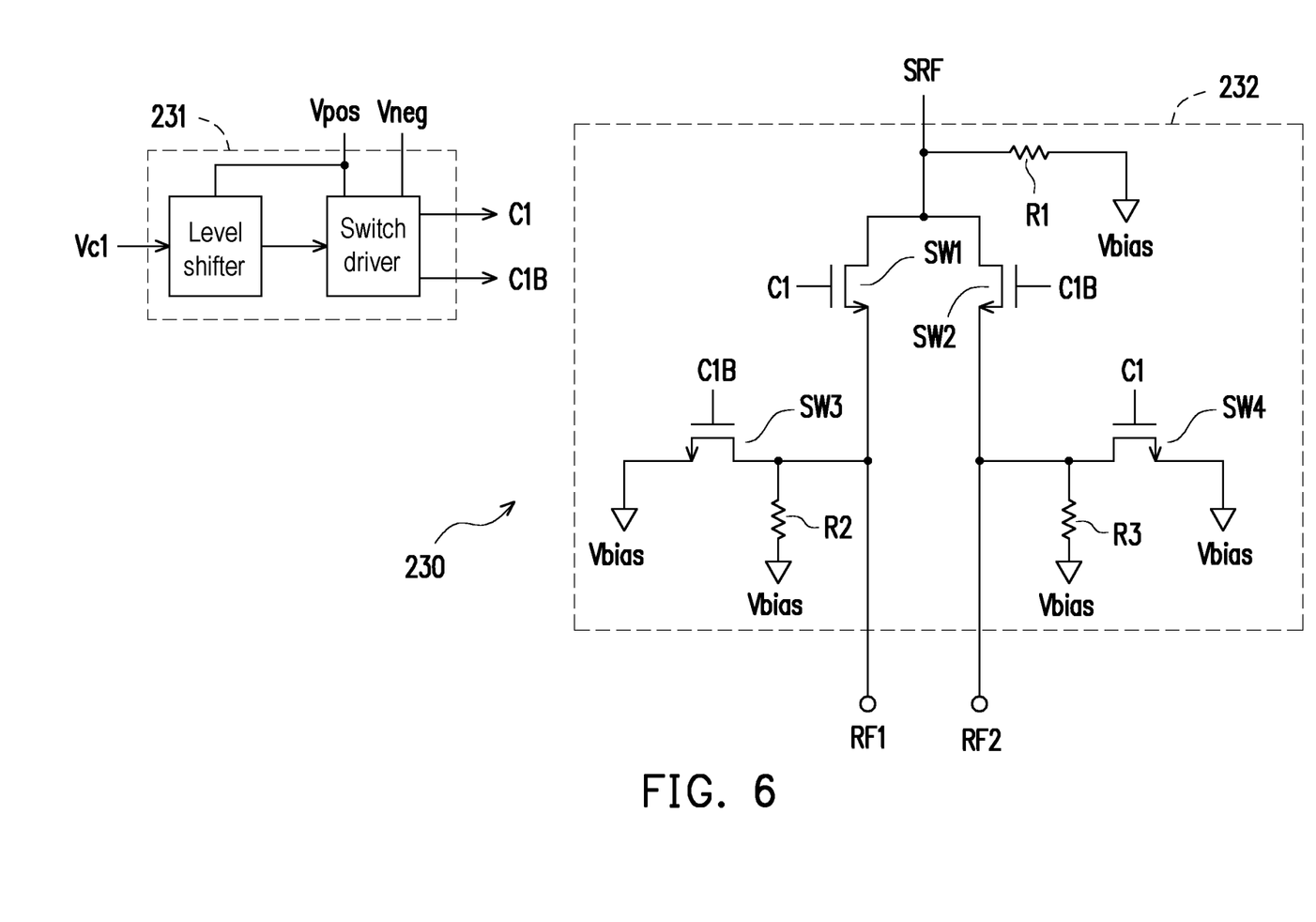
FIG. 6 is a circuit block diagram illustrating the radio frequency circuit shown by FIG. 2, FIG. 3 and FIG. 4 according to an embodiment of the invention.

FIG. 6 is a circuit block diagram illustrating the radio frequency circuit 230 shown by FIG. 2, FIG. 3 and FIG. 4 according to an embodiment of the invention. In the embodiment shown by FIG. 6, the voltage generator 230 includes a driving circuit 231 and a radio frequency transmitting circuit 232. A first power terminal of the driving circuit 231 is coupled to the voltage regulating unit 220 to receive the positive voltage Vpos. A second power terminal of the driving circuit 231 is coupled to the voltage regulating unit 220 to receive the negative voltage Vneg. The driving circuit 231 could generate a control voltage C1 and a control signal C1B related to the control signal Vc1 (the first voltage).

For instance, when the control signal Vc1 is at the high logic level, the driving circuit 231 could select the positive voltage Vpos to be output as the control voltage C1 and select the negative voltage Vneg to be output as the control voltage C1B. When the control signal Vc1 is at the low logic level, the driving circuit 231 could select negative voltage Vneg to be output as the control voltage C1 and select the positive voltage Vpos the to be output as the control voltage C1B.

The radio frequency transmitting circuit 232 is coupled to the driving circuit 231 to receive the control voltage C1 and the control voltage C1B. According to the control voltage C1 and the control voltage C1B, the radio frequency transmitting circuit 232 could control the conducting state of the radio frequency transmission path. In the embodiments shown by FIG. 6, the radio frequency transmission path includes a first path and a second path. The radio frequency transmitting circuit 232 includes a radio frequency switch SW1, a radio frequency switch SW2, a switch SW3, a switch SW4, a resistor R1, a resistor R2 and a resistor R3. A first terminal of the resistor R1 is coupled to a first terminal of radio frequency switch SW1 and a first terminal of the radio frequency switch SW2. A second terminal of the resistor R1 is configured to receive a bias voltage Vbias. The first terminal of the radio frequency switch SW1 could transmit the radio frequency signal SRF. A second terminal of the radio frequency switch SW1 is coupled to the radio frequency transmitting terminal RF1 of the radio frequency transmitting circuit 232. A control terminal of the radio frequency switch SW1 is coupled to the driving circuit 231 to receive the control voltage C1. The radio frequency switch SW1 could provide the first path. The first terminal of the radio frequency switch SW2 could transmit the radio frequency signal SRF. A second terminal of the radio frequency switch SW2 is coupled to the radio frequency transmitting terminal RF2 of the radio frequency transmitting circuit 232. A control terminal of the radio frequency switch SW2 is coupled to the driving circuit 231 to receive the control voltage C1B. The radio frequency switch SW2 could provide the second path.

A first terminal of the resistor R2 is coupled to the second terminal of the radio frequency switch SW1. A second terminal of the resistor R2 is configured to receive the bias voltage Vbias. A first terminal of the switch SW3 is coupled to the second terminal of the radio frequency switch SW1. A control terminal of the switch SW3 is controlled by the control voltage C1B. A second terminal of the switch SW3 is configured to receive the bias voltage Vbias. A first terminal of the resistor R3 is coupled to the second terminal of the radio frequency switch SW2. A second terminal of the resistor R3 is configured to receive the bias voltage Vbias. A first terminal of the switch SW4 is coupled to the second terminal of the radio frequency switch SW2. A control terminal of the switch SW4 is controlled by the control voltage C1. A second terminal of the switch SW4 is configured to receive the bias voltage Vbias. Here, the bias voltage Vbias may be, for example, the ground voltage GND or a fixed voltage.

When the control signal Vc1 is at the high logic level, the radio frequency switch SW1 is turn on, and the radio frequency switch SW2 is turn off. When the control signal Vc1 is at the low logic level, the radio frequency switch SW1 is turn off, and the radio frequency switch SW2 is turn on. The radio-frequency signal SRF could be transmitted to the radio frequency transmitting terminal RF1 or the radio frequency transmitting terminal RF2 according to the logic states of the control signal Vc1 and the control signal Vc2.

Figure 7:
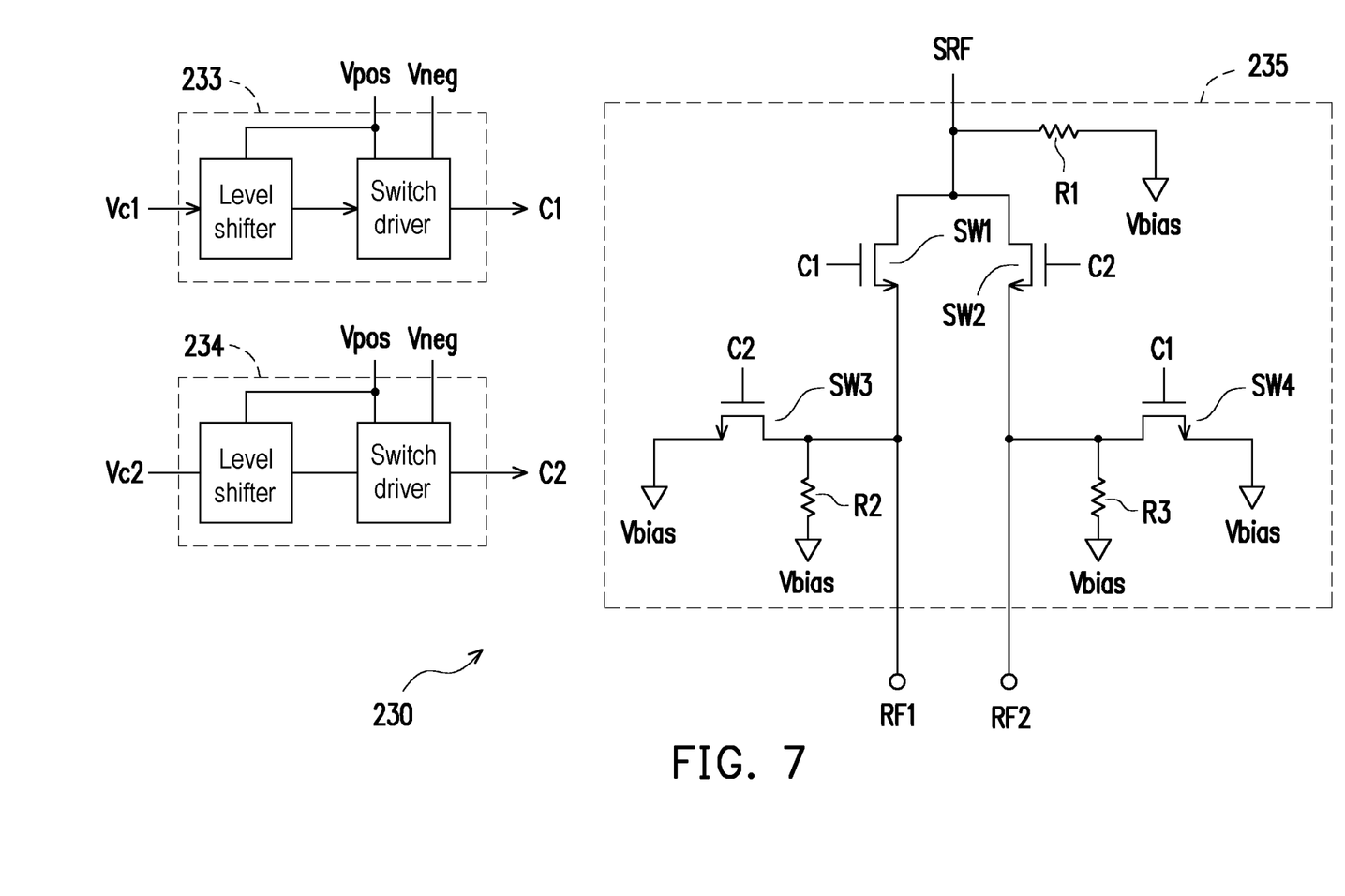
FIG. 7 is a circuit block diagram illustrating the radio frequency circuit shown by FIG. 2, FIG. 3 and FIG. 4 according to another embodiment of the invention.

FIG. 7 is a circuit block diagram illustrating the radio frequency circuit 230 shown by FIG. 2, FIG. 3 and FIG. 4 according to another embodiment of the invention. In the embodiment shown by FIG. 7, the voltage generator 230 includes a driving circuit 233, a driving circuit 234 and a radio frequency transmitting circuit 235. A first power terminal of the driving circuit 233 is coupled to the voltage regulating unit 220 to receive the positive voltage Vpos. A second power terminal of the driving circuit 233 is coupled to the voltage regulating unit 220 to receive the negative voltage Vneg. The driving circuit 233 could generate a control voltage C1 related to the control signal Vc1 (the first voltage). For instance, when the control signal Vc1 is at the high logic level, the driving circuit 233 could select the positive voltage Vpos to be output as the control voltage C1. When the control signal Vc1 is at the low logic level, the driving circuit 233 could select the negative voltage Vneg to be output as the control voltage C1.

A first power terminal of the driving circuit 234 is coupled to the voltage regulating unit 220 to receive the positive voltage Vpos. A second power terminal of the driving circuit 234 is coupled to the voltage regulating unit 220 to receive the negative voltage Vneg. The driving circuit 234 could generate a control voltage C2 related to the control signal Vc2 (the second voltage). For instance, when the control signal Vc2 is at the high logic level, the driving circuit 234 could select the positive voltage Vpos to be output as the control voltage C2. When the control signal Vc2 is at the low logic level, the driving circuit 234 could select the negative voltage Vneg to be output as the control voltage C2.

The radio frequency transmitting circuit 235 is coupled to the driving circuit 233 and the driving circuit 234 to receive the control voltage C1 and the control voltage C2. According to the control voltage C1 and the control voltage C2, the radio frequency transmitting circuit 235 could control the conducting state of the radio frequency transmission path. In the embodiment shown by FIG. 7, the radio frequency transmitting circuit 235 includes a radio frequency switch SW1, a radio frequency switch SW2, a switch SW3, a switch SW4, a resistor R1, a resistor R2 and a resistor R3. The radio frequency switch SW1, the radio frequency switch SW2, the switch SW3, the switch SW4, the resistor R1, the resistor R2 and the resistor R3 shown by FIG. 7 could be referred to the related descriptions of the radio frequency switch SW1, the radio frequency switch SW2, the switch SW3, the switch SW4, the resistor R1, the resistor R2 and the resistor R3 shown by FIG. 6, which are not repeated hereinafter. In the embodiment shown by FIG. 7, a control terminal of the radio frequency switch SW1 is coupled to the driving circuit 233 to receive the control voltage C1. A control terminal of the radio frequency switch SW2 is coupled to the driving circuit 234 to receive the control voltage C2. A control terminal of the switch SW3 is controlled by the control voltage C2. A control terminal of the switch SW4 is controlled by the control voltage C1.

Therefore, when both the control signal Vc1 and the control signal Vc2 are at the low logic level, both the radio frequency switch SW1 and the radio frequency switch SW2 are turn off. When the control signal Vc1 is at the high logic level and the control signal Vc2 is at the low logic level, the radio frequency switch SW1 and the switch SW4 are turn on and the radio frequency switch SW2 and the switch SW3 are turn off so the radio frequency signal SRF could be transmitted to the radio frequency transmitting terminal RF1. When the control signal Vc1 is at the low logic level and the control signal Vc2 is at the high logic level, the radio frequency switch SW1 and the switch SW4 are turn off and the radio frequency switch SW2 and the switch SW3 are turn on so the radio frequency signal SRF could be transmitted to the radio frequency transmitting terminal RF2. In other words, the radio-frequency signal SRF could be transmitted to the radio frequency transmitting terminal RF1 or the radio frequency transmitting terminal RF2 according to the logic states of the control signal Vc1 and the control signal Vc2.

In summary, the voltage generating device according to the embodiments of the invention uses the first voltage (e.g., the control signal Vc1) and the second voltage (e.g., the control signal Vc2) to control the first switch (e.g., 211, 311 or 411) and the second switch (e.g., 212, 312 or 412), respectively. When the first switch (or the second switch) is turn on, the first voltage (or the second voltage) could be transmitted to the output node with almost no voltage loss.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A voltage generating device, comprising:
a first switch, having a first terminal configured to receive a first voltage, wherein a control terminal of the first switch is configured to receive a second voltage;
a second switch, having a first terminal configured to receive the second voltage, wherein a control terminal of the second switch is configured to receive the first voltage, a second terminal of the second switch and a second terminal of the first switch are coupled to an output node, and the output node outputs an output voltage related to at least one of the first voltage and the second voltage,
a third switch, coupled to the first switch; and
a logic circuit, having a NAND gate, wherein the NAND gate of the logic circuit is coupled to the third switch and provides a control voltage to a control terminal of the third switch.

2. The voltage generating device according to claim 1, wherein the first voltage is a first control signal, and the second voltage is a second control signal or a system voltage.

3. The voltage generating device according to claim 1, wherein
when the first voltage is at a high logic level and the second voltage is at a low logic level, the first switch is turned on and the second switch is turned off, and the first switch transmits the first voltage to the output node to generate the output voltage; and
when the first voltage is at the low logic level and the second voltage is at the high logic level, the first switch is turned off and the second switch is turned on, and the second switch transmits the second voltage to the output node to generate the output voltage.

4. The voltage generating device according to claim 1, wherein a first terminal of the third switch is configured to receive the first voltage or the second voltage, and a second terminal of the third switch is coupled to the output node.

5. The voltage generating device according to claim 4, wherein when the first voltage and the second voltage are at a high logic level, the first switch and the second switch are turned off, the third switch is turned on, and the third switch transmits the first voltage or the second voltage to the output node to generate the output voltage.

6. The voltage generating device according to claim 4, wherein the first switch, the second switch and the third switch are metal oxide semiconductor transistors, bipolar junction transistors or heterojunction bipolar transistors.

7. The voltage generating device according to claim 6, wherein the first switch, the second switch and the third switch are P-channel metal oxide semiconductor transistors.

8. The voltage generating device according to claim 4, wherein the logic circuit changes the control voltage according to the first voltage and the second voltage.

9. The voltage generating device according to claim 8, wherein when the first voltage and the second voltage are at a high logic level, the first switch and the second switch are turned off, the logic circuit turns on the third switch by the control voltage, and the third switch transmits the first voltage or the second voltage to the output node as the output voltage.

10. The voltage generating device according to claim 8, wherein the NAND gate of the logic circuit has a first input terminal and a second input terminal for receiving the first voltage and the second voltage, respectively, wherein an output terminal of the NAND gate is coupled to the control terminal of the third switch to provide the control voltage.

11. A voltage generating device comprising:
a first switch, having a first terminal configured to receive a first voltage, wherein a control terminal of the first switch is configured to receive a second voltage;
a second switch, having a first terminal configured to receive the second voltage, wherein a control terminal of the second switch is configured to receive the first voltage, a second terminal of the second switch and a second terminal of the first switch are coupled to an output node, and the output node outputs an output voltage related to at least one of the first voltage and the second voltage;
a logic circuit; and
a voltage generator, including a first diode circuit and a second diode circuit, wherein both the first diode circuit and the second diode circuit of the voltage generator are coupled to a power terminal of the logic circuit, wherein the voltage generator uses the first voltage and the second voltage to generate a regulating voltage, and the voltage generator outputs the regulating voltage to the power terminal of the logic circuit.

12. The voltage generating device according to claim 11, wherein the regulating voltage is smaller than the output voltage.

13. The voltage generating device according to claim 11, wherein:
an anode of the first diode circuit is configured to receive the first voltage, and a cathode of the first diode circuit is coupled to the power terminal of the logic circuit; and
wherein an anode of the second diode circuit is configured to receive the second voltage, and a cathode of the second diode circuit is coupled to the power terminal of the logic circuit.

14. The voltage generating device according to claim 13, wherein any one of the first diode circuit and the second diode circuit comprises:
a transistor, having a first terminal serving as the anode, wherein a control terminal of the transistor is coupled to a second terminal of the transistor, and the second terminal of the transistor serves as the cathode.

15. A radio frequency apparatus, comprising:
a first switch, having a first terminal configured to receive a first voltage, wherein a control terminal of the first switch is configured to receive a second voltage;
a second switch, having a first terminal configured to receive the second voltage, wherein a control terminal of the second switch is configured to receive the first voltage, a second terminal of the second switch and a second terminal of the first switch are coupled to an output node, and the output node outputs an output voltage related to at least one of the first voltage and the second voltage;
a voltage regulating unit, coupled to the output node to receive the output voltage, and configured to generate at least one of a positive voltage and a negative voltage related to the output voltage; and
a radio frequency circuit, coupled to the voltage regulating unit to receive the at least one of the positive voltage and the negative voltage, and configured to control a conducting state of at least one radio frequency transmission path of the radio frequency circuit according to the first voltage.

16. The radio frequency apparatus according to claim 15, further comprising:
a capacitor, having a first terminal coupled to the output node to receive the output voltage, wherein a second terminal of the capacitor is coupled to a reference potential.

17. The radio frequency apparatus according to claim 15, wherein the radio frequency circuit comprises:
a first driving circuit, wherein a first power terminal of the first driving circuit is coupled to the voltage regulating unit to receive the positive voltage, a second power terminal of the first driving circuit is coupled to the voltage regulating unit to receive the negative voltage, and the first driving circuit is configured to generate a first control voltage related to the first voltage;
a second driving circuit, wherein a first power terminal of the second driving circuit is coupled to the voltage regulating unit to receive the positive voltage, a second power terminal of the second driving circuit is coupled to the voltage regulating unit to receive the negative voltage, and the second driving circuit is configured to generate a second control voltage related to the second voltage; and
a radio frequency transmitting circuit, coupled to the first driving circuit and the second driving circuit to receive the first control voltage and the second control voltage, and configured to control the conducting state of the at least one radio frequency transmission path according to the first control voltage and the second control voltage.

18. The radio frequency apparatus according to claim 15, wherein the radio frequency circuit comprises:
a driving circuit, wherein a first power terminal of the driving circuit is coupled to the voltage regulating unit to receive the positive voltage, a second power terminal of the driving circuit is coupled to the voltage regulating unit to receive the negative voltage, and the driving circuit is configured to generate a first control voltage and a second control voltage related to the first voltage; and
a radio frequency transmitting circuit, coupled to the driving circuit to receive the first control voltage and the second control voltage, and configured to control the conducting state of the at least one radio frequency transmission path according to the first control voltage and the second control voltage.

19. The radio frequency apparatus according to claim 18, wherein the at least one radio frequency transmission path comprises a first path and a second path, and the radio frequency transmitting circuit comprises:
a first radio frequency switch, configured to provide the first path, wherein a first terminal of the first radio frequency switch is configured to transmit a radio frequency signal, a second terminal of the first radio frequency switch is coupled to a first radio frequency transmitting terminal of the radio frequency transmitting circuit, and a control terminal of the first radio frequency switch is coupled to the driving circuit to receive the first control voltage; and
a second radio frequency switch, configured to provide the second path, wherein a first terminal of the second radio frequency switch is configured to transmit the radio frequency signal, a second terminal of the second radio frequency switch is coupled to a second radio frequency transmitting terminal of the radio frequency transmitting circuit, and a control terminal of the second radio frequency switch is coupled to the driving circuit to receive the second control voltage.

20. The radio frequency apparatus according to claim 19, wherein the radio frequency transmitter circuit further comprises:
a first resistor, having a first terminal coupled to the first terminal of the first radio frequency switch and the first terminal of the second radio frequency switch, wherein a second terminal of the first resistor is configured to receive a bias voltage;
a second resistor, having a first terminal coupled to the second terminal of the first radio frequency switch, wherein a second terminal of the second resistor is configured to receive the bias voltage;
a third resistor, having a first terminal coupled to the second terminal of the second radio frequency switch, wherein a second terminal of the third resistor is configured to receive the bias voltage;
a first switch, having a first terminal coupled to the second terminal of the first radio frequency switch, wherein a control terminal of the first switch is controlled by the second control voltage, and a second terminal of the first switch is configured to receive the bias voltage; and
a second switch, having a first terminal coupled to the second terminal of the second radio frequency switch, wherein a control terminal of the second switch is controlled by the first control voltage, and a second ten al of the second switch is configured to receive the bias voltage.

* * * * *